(12) United States Patent
Merlet et al.

(10) Patent No.: US 8,837,117 B2
(45) Date of Patent: Sep. 16, 2014

(54) MODULAR ELECTRICAL CARD FOR POWER COMPONENTS

(75) Inventors: Etienne Merlet, Paris (FR); Jean-Eric Besold, Saclay (FR); Marie-Noëlle Besold-Etchechoury, legal representative, Saclay (FR)

(73) Assignee: Sagem Defense Securite, Paris (FR)

( * ) Notice: Subject to any disclaimer, the term of this patent is extended or adjusted under 35 U.S.C. 154(b) by 253 days.

(21) Appl. No.: 13/142,223

(22) PCT Filed: Dec. 21, 2009

(86) PCT No.: PCT/FR2009/001467
§ 371 (c)(1),
(2), (4) Date: Jul. 20, 2011

(87) PCT Pub. No.: WO2010/072919
PCT Pub. Date: Jul. 1, 2010

(65) Prior Publication Data
US 2011/0317374 A1    Dec. 29, 2011

(30) Foreign Application Priority Data

Dec. 24, 2008   (FR) ..................................... 08 07453

(51) Int. Cl.
| | |
|---|---|
| *H02B 1/20* | (2006.01) |
| *H02B 13/02* | (2006.01) |
| *H02B 1/26* | (2006.01) |
| *G06F 1/16* | (2006.01) |
| *H05K 5/00* | (2006.01) |
| *H05K 7/00* | (2006.01) |
| *H05K 7/16* | (2006.01) |
| *H05K 1/14* | (2006.01) |
| *H05K 1/00* | (2006.01) |
| *H05K 1/18* | (2006.01) |
| *H05K 1/11* | (2006.01) |
| *H05K 7/14* | (2006.01) |
| *H05K 7/18* | (2006.01) |
| *H05K 1/03* | (2006.01) |
| *H05K 1/02* | (2006.01) |

(52) U.S. Cl.
CPC .... *H05K 7/1432* (2013.01); *H05K 2201/10272* (2013.01); *H05K 7/1461* (2013.01); *H05K 1/0263* (2013.01)
USPC ........... 361/637; 361/611; 361/614; 361/622; 361/624; 361/639; 361/648; 361/679.02; 361/679.31; 361/679.32; 361/679.33; 361/679.4; 361/679.41; 361/727; 361/736; 361/740; 361/747; 361/748; 361/794; 361/796; 361/799; 174/250; 174/254; 174/255; 174/268

(58) Field of Classification Search
USPC ................. 361/799, 796, 748, 679.02, 679.4, 361/679.31, 679.32, 679.33, 679.41, 727, 361/736, 737, 740, 741, 747, 780, 794, 611, 361/614, 622, 624, 637, 639, 648; 439/76.1, 76.2; 174/250, 254, 255, 174/261, 268
See application file for complete search history.

(56) References Cited

U.S. PATENT DOCUMENTS

| 6,205,029 B1 * | 3/2001 | Byrne et al. .................. 361/724 |
| 2003/0133282 A1 | 7/2003 | Beihoff |
| 2006/0052914 A1 | 3/2006 | Kubokawa |

FOREIGN PATENT DOCUMENTS

| EP | 1 614 317 A1 | 1/2006 |
| FR | 2 805 961 | 9/2001 |
| FR | 2 826 544 | 12/2002 |

*Primary Examiner* — Anthony Haughton
*Assistant Examiner* — Zhengfu Feng
(74) *Attorney, Agent, or Firm* — Muncy, Geissler, Olds & Lowe, P.C.

(57) ABSTRACT

The electrical card has power modules constituted by power components and by control components that are carried by strips fastened on a support plate comprising an electrical ground plate. The power components are connected firstly to control buses, and secondly to power buses carried by the support plate and extending in a layer adjacent to the electrical ground plate.

10 Claims, 2 Drawing Sheets

MODULAR ELECTRICAL CARD FOR POWER COMPONENTS

The present invention relates to a modular electrical card, and more particularly, but not exclusively, to a circuit breaker module card.

BACKGROUND OF THE INVENTION

Given the increasing use of electrical controls in vehicles, whether land vehicles or aircraft, it is now common practice to fit such vehicles with electrical units that contain electrical cards including power components. In order to facilitate the maintenance of an electrical unit, functions are generally performed by components that are grouped together in power modules, each of which comprises power components and control components.

In existing cards, power buses are generally made in the form of multi-layer circuits, each module being powered by a conductor plane that is made from a single layer. That configuration makes it possible to adapt the layout of the power supply planes to the arrangement of the power components on the card.

Nevertheless, the currents that are conveyed in power modules may reach large magnitudes, for example several tens of amps. Such currents heat the conductors, and present devices provide poor diffusion of heat, such that the temperature inside an electrical card can reach critical values, in particular when the electrical card is mounted in an airplane that is designed to fly at high altitudes where the air is rarefied, or indeed in the event of a failure of a fan device in the electrical unit that supports the electrical card.

OBJECT OF THE INVENTION

An object of the invention is to provide an electrical card that is entirely modular and configurable, and in which the modules are of a structure that provides improved cooling.

SUMMARY OF THE INVENTION

In order to achieve these objects, the invention provides an electrical card having power modules constituted by power components and by control components that are carried by strips fastened on a support plate comprising an electrical ground plate, the power components being connected firstly to control buses, and secondly to power buses carried by the support plate and extending in a layer adjacent to the electrical ground plate.

Thus, maintenance of the electrical card containing power components is made easier and the electrical ground plate acts as a heatsink. Because of its large dimensions, it serves to diffuse heat quickly.

Preferably, the support plate also includes a metal mechanical-backing plate on a side of the power buses that is opposite from the electrical ground plate.

The metal reinforcement plate also acts as a heatsink and it possesses large dimensions that enable it to diffuse heat quickly.

In an advantageous version of the invention, the power buses extend in a single layer adjacent to one of the faces of the electrical ground plate, and the connection buses extend on a face of the electrical ground plate that is opposite from the power buses.

Thus, the ground plate serves not only to diffuse the heat generated by the power components, but it also provides thermal and electromagnetic protection to the connection buses and to the associated control components.

According to other advantageous characteristics of the invention, the power components are carried by power strips extending perpendicularly to the electrical ground plate and arranged so as to co-operate with the electrical ground plate to define elongate channels, the control components are carried by strips extending in the channels, being spaced apart from the power strips, and preferably the control components are carried by control strips extending in an axial direction of the channels halfway between the ends of the channels. Thus, the control components are located in the middles of the air streams flowing in the channels, thereby minimizing the heating that results from heat being transmitted from the power components by conduction or by radiation.

BRIEF DESCRIPTION OF THE DRAWINGS

Other characteristics and advantages of the invention appear on reading the following description of a particular, nonlimiting embodiment of the card of the invention, given with reference to the accompanying figures, in which.

DETAILED DESCRIPTION OF THE INVENTION

Figure 1:
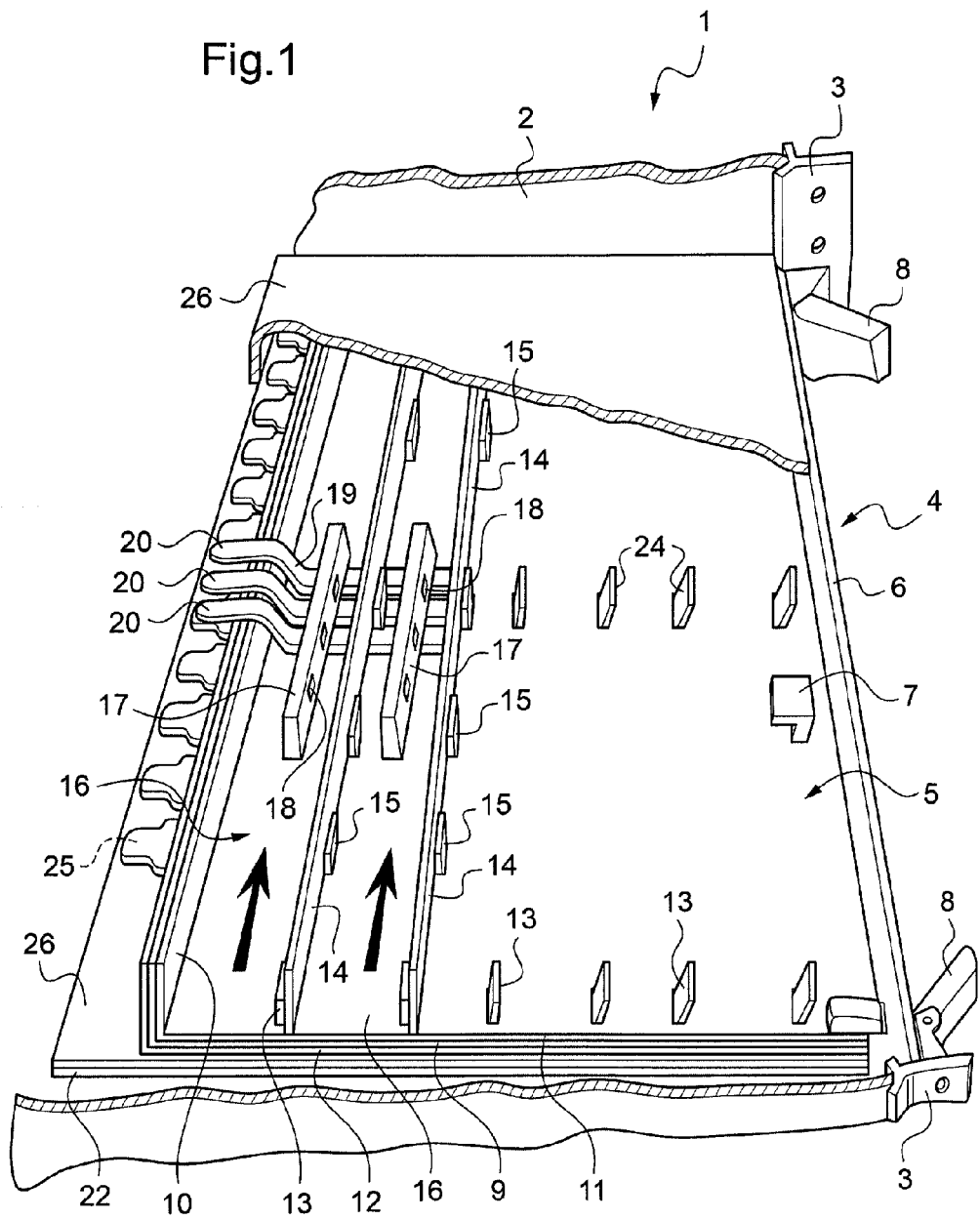
FIG. 1 is a diagrammatic perspective view of an electrical card of the invention.

With reference to FIG. 1, the electrical unit given overall reference 1 comprises an outer casing 2 having support rails 3 fastened therein, with cards 4 fixed to the rails, only one card being shown in figures.

In the embodiment shown, the unit is drawn lying on one side. Each card 4 comprises a support plate 5 that, when in the mounted position, extends vertically inside the unit. On its edge corresponding to the support rail 3, each card is fitted with a front wall 6 that is fastened to the support plate 5 perpendicularly thereto by assembly blocks 7 and that is fitted with locking members 8 that co-operate with the support rails 3.

Figure 2:
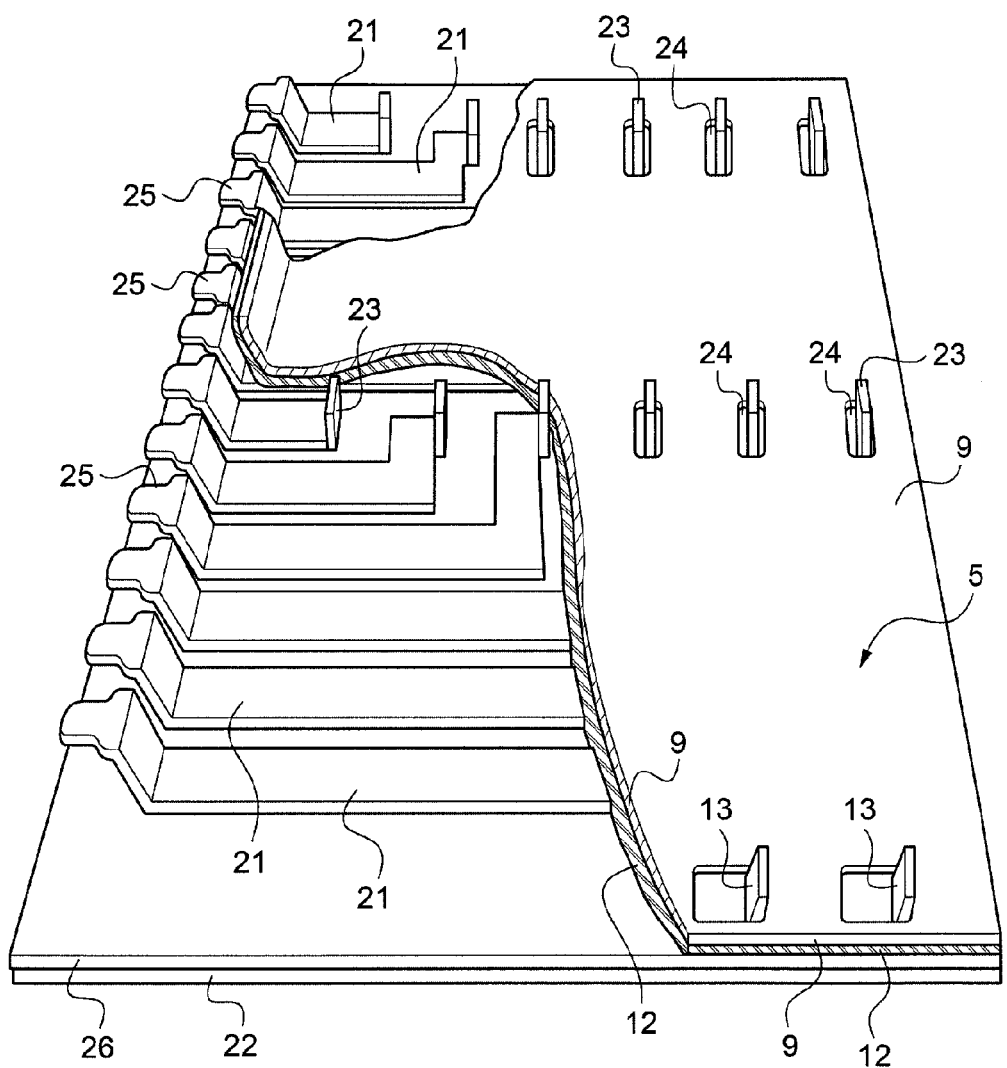
FIG. 2 is a perspective view analogous to that of FIG. 1, with certain layers partially cut away.

The support plate 5 comprises a metal electrical ground plate 9 that can be seen more clearly in FIG. 2, on which component strips and connection buses connecting with the control components are shown separated, and that is partially cut away in order to show more clearly the structure of the power buses. Along its rear edge, the electrical ground plate 9 is folded into an L-shape. The folded portion 10 forms the rear wall of the card. The electrical ground plate 9 is sandwiched between two layers of insulating material 11 and 12.

At one of its ends, the electrical ground plate 9 has electrical ground tabs 13 cut out from the electrical ground plate 9 and folded perpendicularly thereto so as to project from one of the faces of the electrical ground plate 9.

The support plate 5 is fitted with power strips 14 carrying power components 15 and connected to the electrical ground tabs 13 so as to extend perpendicularly to the support plate 5 in a longitudinal direction thereof in such a manner as to define longitudinal channels 16 in which air can flow, as represented by bold arrows in FIG. 1, under natural convection or as forced ventilation using a fan device (not shown).

According to an aspect of the invention, each module also has control strips 17 that are separate from the power strips 14 and that carry control components 18. The control strips preferably extend halfway from the ends of the channels defined by the power strips. The control strips thus constitute constrictions in the section of the duct, thereby giving rise to a local acceleration in the cooling stream. The control strips 17 are connected by connection buses 19 that are fitted at one end with connection tabs 20 enabling the connection buses 19 to be connected (by means of connectors not shown) to control circuits external to the module. These connection buses 19 may be made in the form of a conventional electronic card, fitted with a male connector including the connection tabs 20.

As shown in FIG. 2, the support plate 5 in this example includes power buses 21 that are in the form of conductive straps sandwiched between the electrically insulating layer 12 and an electrically insulating layer 26 covering a metal mechanical-backing plate 22 on its inside face, beside the power buses 21. In the preferred embodiment shown, the power buses 21 extend in a single layer that is immediately adjacent firstly to the electrical ground plate 9 from which it is separated solely by the insulating layer 12, and secondly to the mechanical-backing plate 22 from which it is separated solely by the insulating layer 26. The power buses 21 are in the form of mutually inter-fitting L-shapes and each includes at one end a power connection tab 23 that extends through an opening 24 in the electrical ground plate 9 and that is connected to one of the power strips 14.

In the preferred embodiment shown, the power connection tabs 24 are in alignment both in the longitudinal direction and in the transverse direction of the support plate 5, such that the power strips 14 may be of identical structure regardless of the functions they perform, thereby simplifying modularity and assembly of a module.

At their ends opposite from the power connection tabs 23, the power buses 21 are fitted with connection tabs 25 connecting with an external connector (not shown).

It should be observed that the command buses 19 extend on a face of the electrical ground plate 9 that is opposite from the face on which the power buses 21 extend. Thus, the heat transmitted by the power buses 21 is dissipated by the electrical ground plate 9 and by the mechanical-backing plate 22, such that the control buses 19 and the control members 18 that are associated therewith are protected against excessive heating. In addition, the electrical ground plate 9 forms an electromagnetic shield between the power buses 21 and the control buses 19, and the mechanical-backing plate 22 forms an electromagnetic shield between the electronic card as a whole and its outside environment within the unit 1.

The module is closed by an L-shaped cover 26.

Naturally, the invention is not limited to the preferred embodiment shown, and it may be subjected to embodiment variations that appear to the person skilled in the art without going beyond the ambit of the invention as defined by the claims.

In particular, although the invention is shown with power buses extending in a single layer, provision may be made to use a support plate in which the power buses extend in two layers on either side of the ground plate, so as to use the ground plate as a radiator. Under such circumstances, it would be preferable to group together the control components in a separate module.

Although the power buses 21 are shown as being L-shaped straps, they may be made using conductors of any shape.

Although the support plate is shown as being L-shaped so as to form a rear wall of the module, provision may be made for a support plate that is plane having a rear wall of the module fastened thereto.

Although the electrical ground tabs 13 are shown as being grouped together at one end of the electrical ground plate 9, the electrical ground tabs 13 could be provided in the central portion, or in any arbitrary arrangement on the card.

What is claimed is:

1. An electrical card having power modules constituted by power components and by control components, wherein the power components and the control components are carried by strips fastened on a support plate comprising an electrical ground plate, the power components being disposed in front of a principal face of the support plate and being connected firstly to control buses, and secondly to power buses, the control buses and the power buses being carried by the support plate and extending in a layer adjacent to the electrical ground plate.

2. The electrical card according to claim 1, wherein the support plate also includes a metal mechanical-backing plate on a side of the power buses that is opposite from the electrical ground plate.

3. The electrical card according to claim 1, wherein the power buses extend in a single layer adjacent to one of a plurality of faces of the electrical ground plate, and wherein the control buses extend on a face of the electrical ground plate that is opposite from the power buses.

4. The electrical card according to claim 1, wherein the power components are carried by power strips extending perpendicularly to the electrical ground plate and arranged so as to co-operate with the electrical ground plate to define elongate channels.

5. The electrical card according to claim 4, wherein the control components are carried by control strips extending in the channels defined by the power strips, being spaced apart therefrom.

6. The electrical card according to claim 4, wherein the control components are carried by control strips extending in an axial direction of the channels.

7. The electrical card according to claim 6, wherein the control strips extend halfway from the ends of the channels.

8. The electrical card according to claim 1, wherein the power buses comprise mutually adjacent straps having ends that form projecting tabs that are in alignment both in a longitudinal direction and in a transverse direction of the support plate.

9. The electrical card according to claim 8, wherein the power buses are of L-shapes that are mutually engaged one in another.

10. The electrical card according to claim 1, wherein the support plate presents an L-shape, with a portion thereof forming a rear wall of the power module.

* * * * *